(12) United States Patent
Abe et al.

(10) Patent No.: US 8,039,873 B2
(45) Date of Patent: Oct. 18, 2011

(54) SEMICONDUCTOR DEVICE

(75) Inventors: Kazuhide Abe, Kawasaki (JP);
Tadahiro Sasaki, Tokyo (JP); Kazuhiko Itaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 12/276,787

(22) Filed: Nov. 24, 2008

(65) Prior Publication Data

US 2009/0134430 A1 May 28, 2009

(30) Foreign Application Priority Data

Nov. 27, 2007 (JP) ................. 2007-306030

(51) Int. Cl.
*H01L 27/105* (2006.01)

(52) U.S. Cl. ........ 257/202; 257/288; 257/368; 257/390; 257/401; 257/405; 257/E25.01; 257/E25.002; 257/E25.005

(58) Field of Classification Search .............. 257/202, 257/288, 368, 390, 401, 405
See application file for complete search history.

(56) References Cited

U.S. PATENT DOCUMENTS

| | | | | |
|---|---|---|---|---|
| 5,406,104 A * | 4/1995 | Hirota et al. | ................. | 257/351 |
| 6,134,424 A | 10/2000 | Nishihori et al. | | |
| 6,479,905 B1 * | 11/2002 | Song | ............................ | 257/365 |
| 6,750,517 B1 * | 6/2004 | Ker et al. | ....................... | 257/401 |
| 2005/0189595 A1 * | 9/2005 | Okamoto et al. | ............. | 257/368 |
| 2006/0113533 A1 * | 6/2006 | Tamaki et al. | ................... | 257/48 |
| 2008/0061871 A1 | 3/2008 | Abe et al. | | |
| 2008/0238550 A1 * | 10/2008 | Sasaki et al. | .................. | 330/277 |
| 2008/0258815 A1 * | 10/2008 | Abe et al. | ...................... | 330/277 |
| 2009/0121291 A1 * | 5/2009 | Anderson et al. | ............. | 257/365 |
| 2009/0243725 A1 * | 10/2009 | Abe et al. | ...................... | 330/277 |

FOREIGN PATENT DOCUMENTS

| | | |
|---|---|---|
| JP | 2000-332568 | 11/2000 |
| JP | 2007-60616 | 3/2007 |

OTHER PUBLICATIONS

U.S. Appl. No. 12/873,788, filed Sep. 1, 2010, Abe et al.

* cited by examiner

*Primary Examiner* — A. Sefer

(74) *Attorney, Agent, or Firm* — Oblon, Spivak, McClelland, Maier & Neustadt, L.L.P.

(57) ABSTRACT

A semiconductor device includes a substrate including an element region having a polygonal shape defined by a plurality of edges, and an isolation region surrounding the element region, and a plurality of gate electrodes provided on the substrate, crossing the element region, arranged in parallel with each other, and electrically connected with each other, wherein at least one of the edges does not cross any of the gate electrodes, and is not parallel to the gate electrodes.

5 Claims, 14 Drawing Sheets

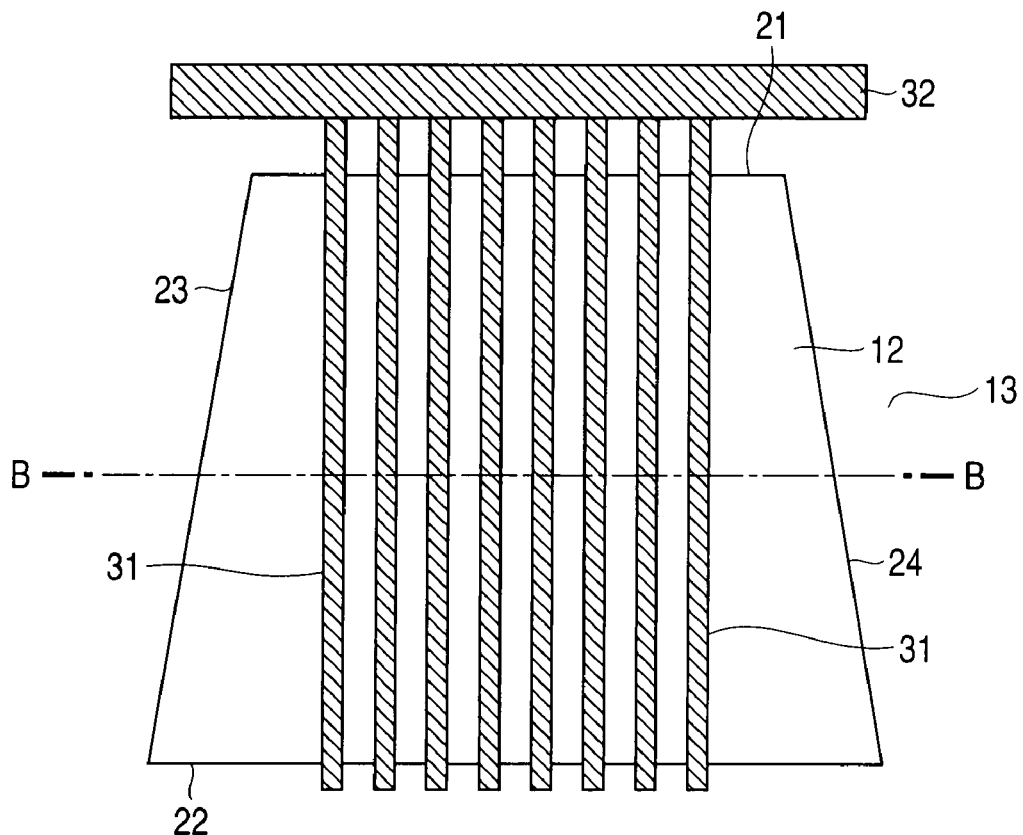
F I G. 4A
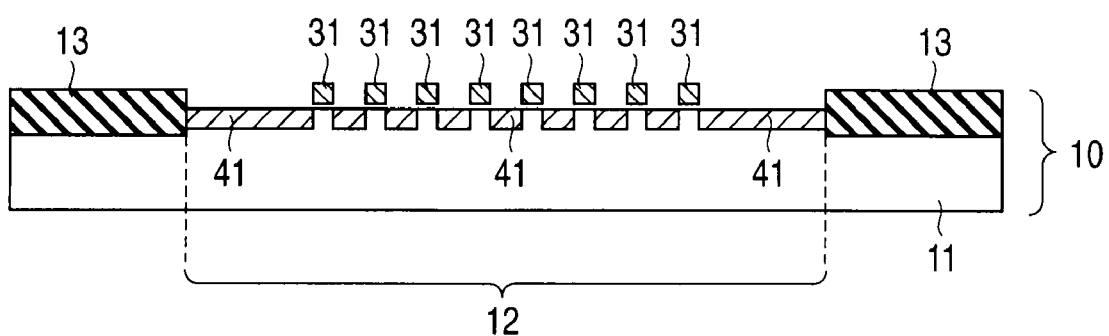
F I G. 4B

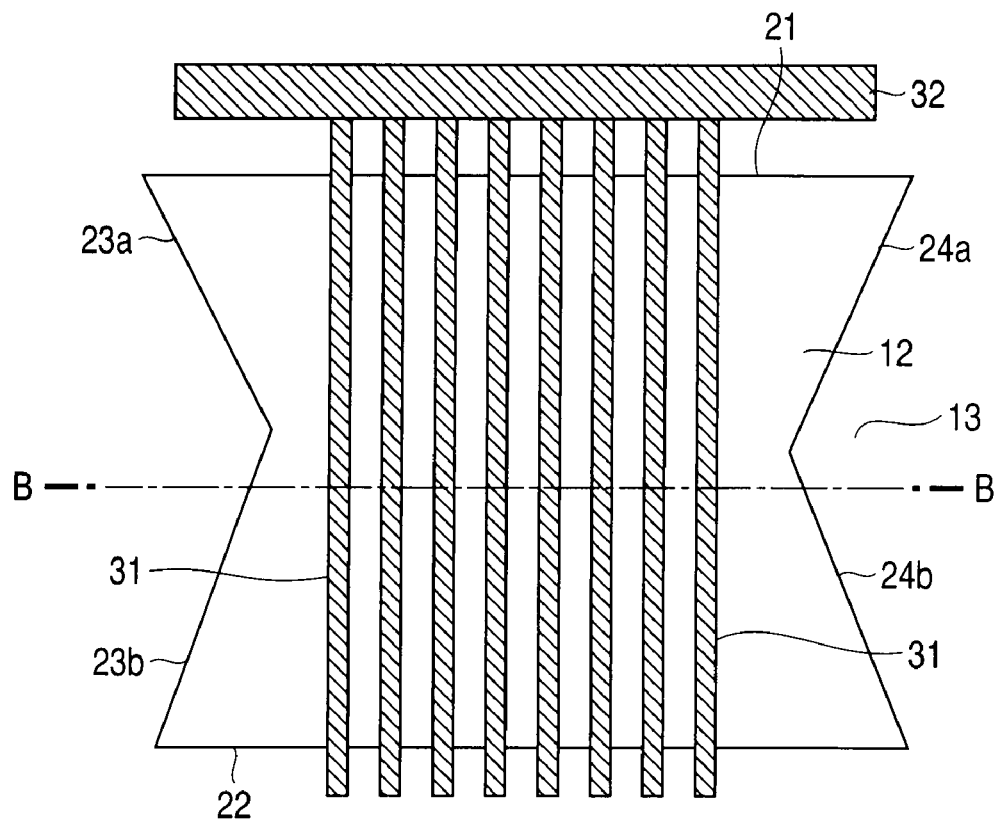
F I G. 10A
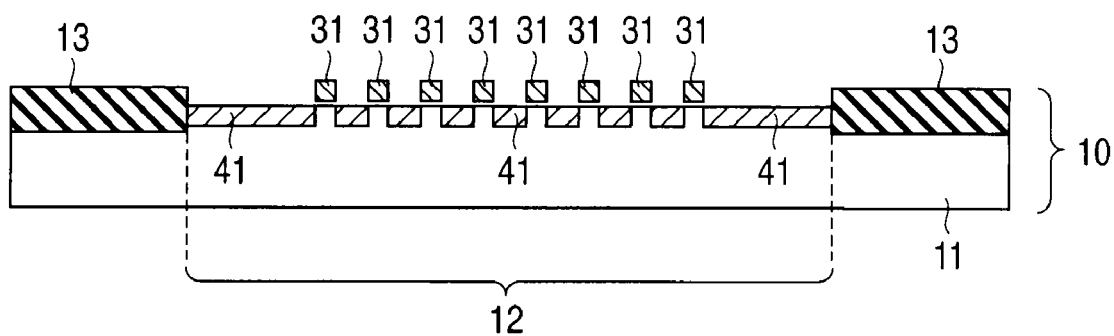
F I G. 10B

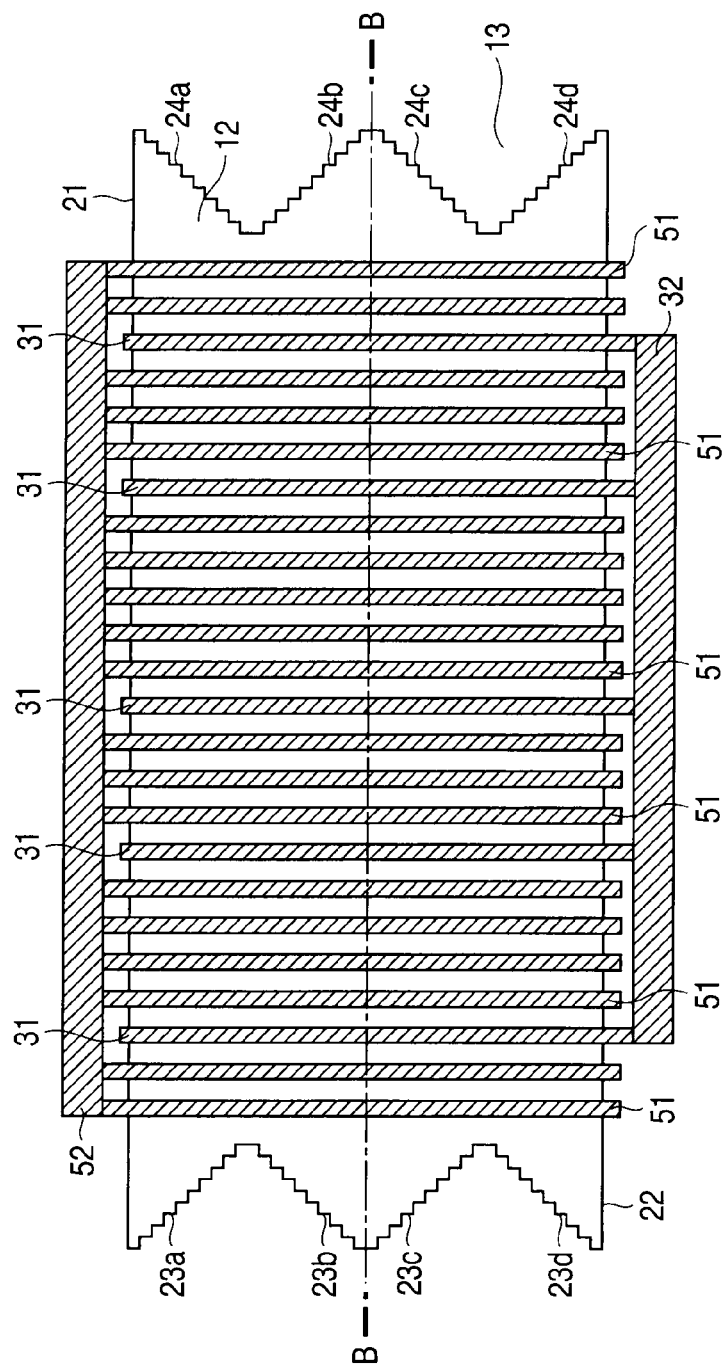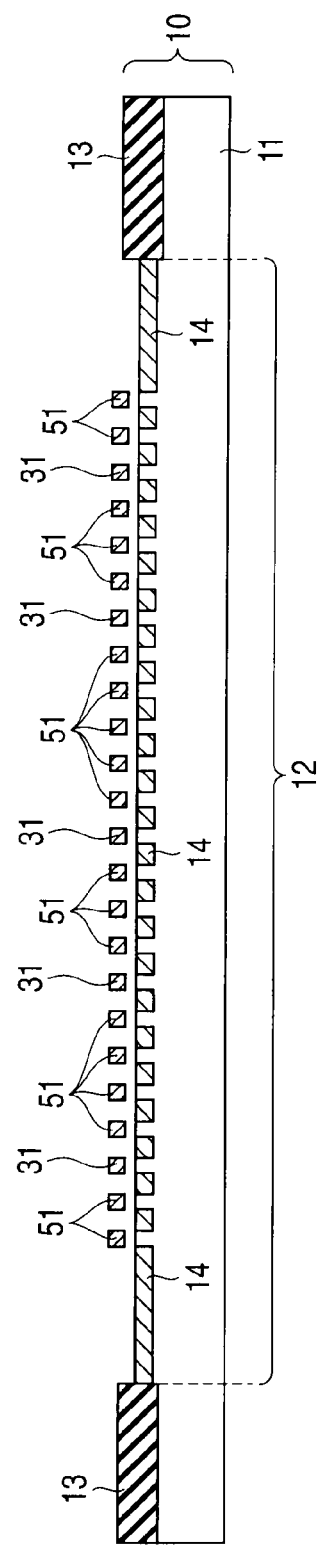
FIG. 13A
FIG. 13B

US 8,039,873 B2

SEMICONDUCTOR DEVICE

CROSS-REFERENCE TO RELATED APPLICATIONS

This application is based upon and claims the benefit of priority from prior Japanese Patent Application No. 2007-306030, filed Nov. 27, 2007, the entire contents of which are incorporated herein by reference.

BACKGROUND OF THE INVENTION

1. Field of the Invention

The present invention relates to a semiconductor device.

2. Description of the Related Art

Recently, the following technique has been proposed (see JP-A 2007-60616 (KOKAI)). According to the foregoing technique, a CMOS circuit is used for a high-frequency power amplifier of a transmitter of a mobile wireless terminal. In particular, the following structure has been proposed in order to obtain a large output current. According to the structure, a plurality of transistors is arranged in the same element region, and these transistors are connected in parallel. In this case, the layout structure called a multi-finger is usually employed. According to the multi-finger type layout structure, a plurality of gate electrodes is arranged in parallel and electrically connected in the same element region.

However, a semiconductor device having the foregoing multi-finger type layout structure does not necessarily provide a structure for realizing excellent characteristics.

BRIEF SUMMARY OF THE INVENTION

A first aspect of the present invention, there is provided a semiconductor device comprising: a substrate including an element region having a polygonal shape defined by a plurality of edges, and an isolation region surrounding the element region; and a plurality of gate electrodes provided on the substrate, crossing the element region, arranged in parallel with each other, and electrically connected with each other, wherein at least one of the edges does not cross any of the gate electrodes, and is not parallel to the gate electrodes.

A second aspect of the present invention, there is provided a semiconductor device comprising: a substrate including an element region and an isolation region surrounding the element region; first, second and third gate electrodes provided on the substrate, crossing the element region, arranged in parallel with each other, and electrically connected with each other; first dummy gate electrodes provided between the first and second gate electrodes, and parallel with the first, second and third gate electrodes; second dummy gate electrodes provided between the second and third gate electrodes, and parallel with the first, second and third gate electrodes, wherein the number of the first dummy gate electrodes is different from the number of the second dummy gate electrodes.

A third aspect of the present invention, there is provided a semiconductor device comprising: a substrate including an element region having a polygonal shape defined by a plurality of edges, and an isolation region surrounding the element region; and a plurality of gate electrodes provided on the substrate, crossing the element region, arranged in parallel with each other, and electrically connected with each other, wherein two of the edges crossed by the gate electrodes are not parallel with each other.

BRIEF DESCRIPTION OF THE SEVERAL VIEWS OF THE DRAWING

FIG. 4A and FIG. 4B are views schematically showing the structure of a semiconductor device according to the first embodiment;

FIG. 10A and FIG. 10B are views schematically showing the structure of a semiconductor device according to the fourth embodiment;

FIG. 13A and FIG. 13B are views schematically showing the structure of a semiconductor device according to a seventh embodiment;

DETAILED DESCRIPTION OF THE INVENTION

A comparison example will be described below before the explanation about various embodiments of the present invention.

Figure 1:
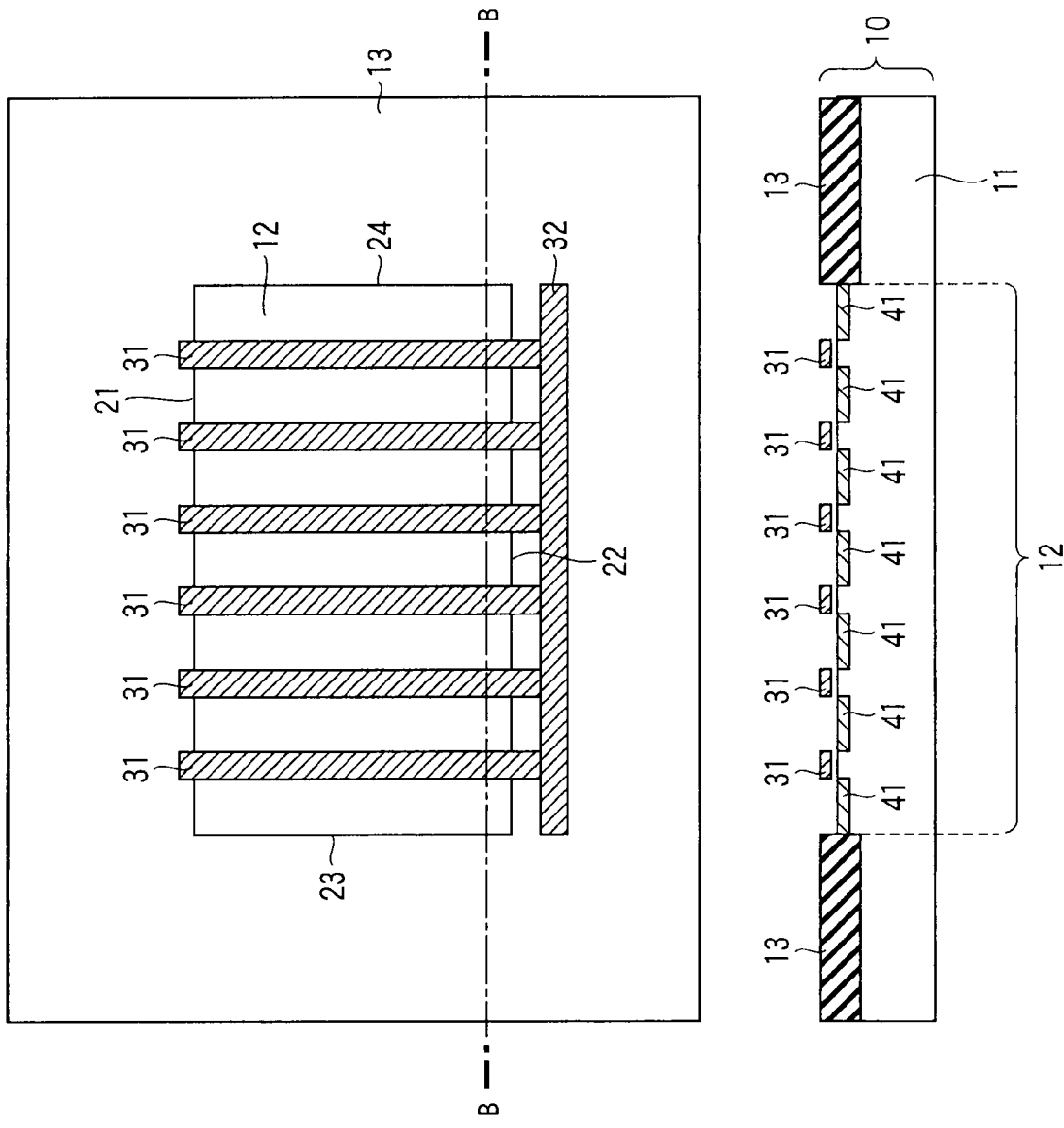
FIG. 1A and FIG. 1B are views schematically showing the structure of a semiconductor device according to a comparison example.

FIG. 1A and FIG. 1B are views schematically illustrating the structure of a semiconductor device (having a multi-finger type layout structure) according to the comparison example. FIG. 1A is a plan view, and FIG. 1B is a cross-sectional view taken along the line B-B of FIG. 1A.

As shown in FIG. 1A and FIG. 1B, a semiconductor substrate (silicon substrate) 11 is provided with an element region 12. The element region 12 is surrounded by an isolation region 13 formed of an insulating film. The element region 12 has a rectangular shape defined by four edges 21 to 24.

A plurality of gate electrodes 31 is formed on the substrate having the foregoing element region 12 and the isolation region 13 with a gate insulating film (not shown) interposed therebetween. The foregoing gate electrodes are arranged in parallel with a same pitch, and electrically connected via a common electrode 32. The gate electrodes 31 have a same width (in the channel length direction). The gate electrodes 31 cross the element region 12. In other words, the gate electrodes 31 cross two edges 21 and 22. More specifically, the gate electrodes 31 cross vertically to the edges 21 and 22. The gate electrodes 31 are arranged in parallel with the edges 23 and 24 so that they do not cross the edges 23 and 24. The surface portion of the element region 12 is formed with a source/drain diffusion layer 41. A region between neighboring diffusion layers 41 functions as a channel region.

As described above, the semiconductor device having the multi-finger type layout structure has the following configuration. Specifically, a plurality of MOS transistors (MIS transistors) is arranged in the same element region, and these MOS transistors are electrically connected in parallel. As a result, it is possible to obtain a large output current, and to use the semiconductor device for a high-frequency power amplifier of a transmitter of a mobile wireless terminal, for example.

However, the inventors of this application confirmed that there is the case where the semiconductor device having the foregoing structure does not always show normal characteristics.

Figure 2:
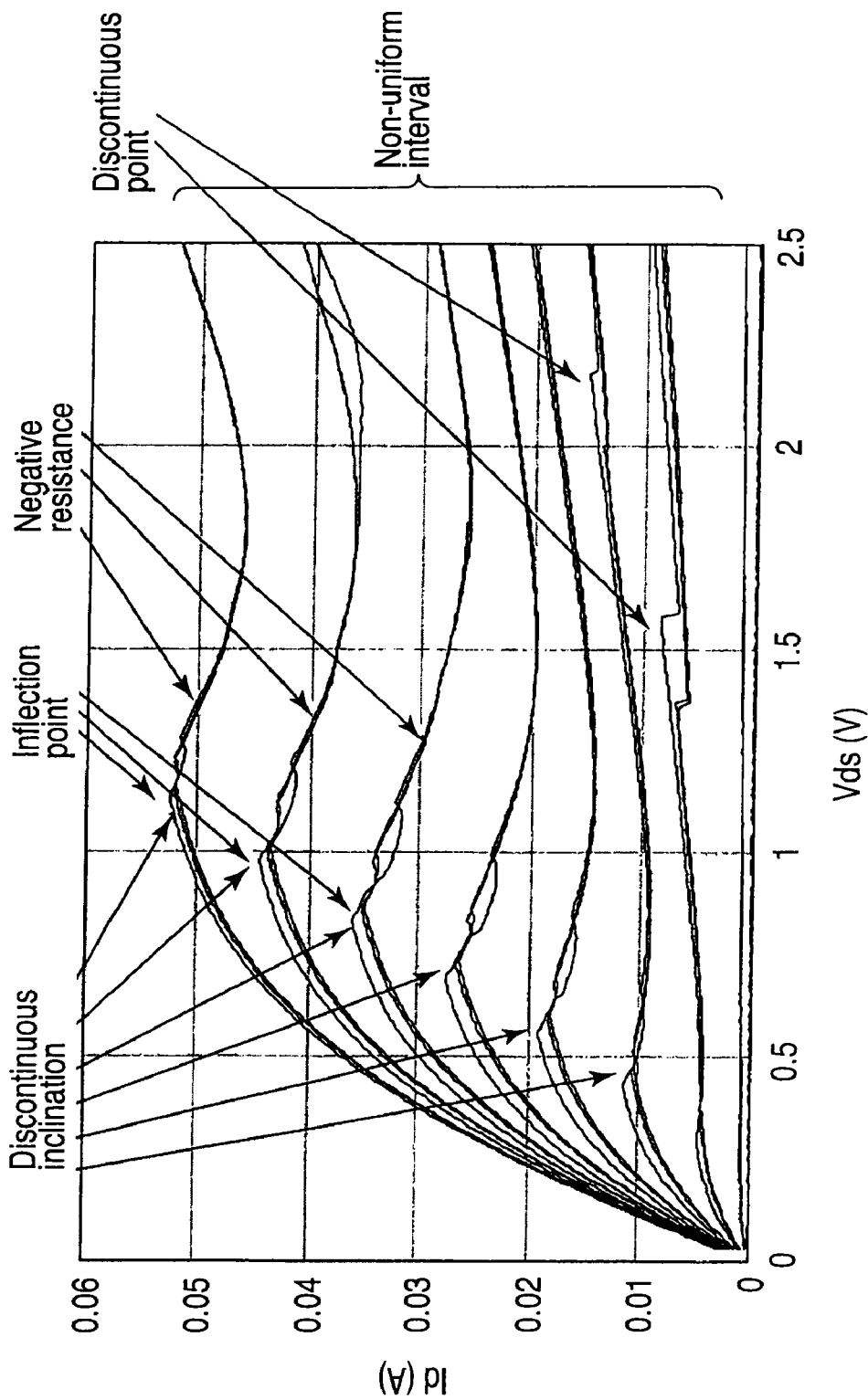
FIG. 2 is a graph to explain problems of electric characteristics of the semiconductor device according to the comparison example.

FIG. 2 is a graph showing electric characteristics of a semiconductor device having the foregoing structure. In the graph of FIG. 2, the horizontal axis takes a drain voltage Vds, and the vertical axis takes a drain current Id. In this case, a gate voltage Vgs is changed as a parameter. The measurement was made using an n-type MOS transistor having a gate length of 0.3 μm and a gate width 5.2 μm. The number of gate electrodes is 24; therefore, the total gate width is 124.8 μm. A semiconductor parameter analyzer was used for the measurement.

As seen from FIG. 2, the following abnormal characteristics have been observed; specifically, they have shown negative resistance, discontinuous points of drain current, discontinuous points of the inclination of the drain current and inflection points. The foregoing abnormal transistor characteristics can not be explained using a circuit simulation model. Thus, the transistor having the foregoing abnormal characteristics is not suitable to use in analog circuits. Accordingly, it is difficult to apply the transistor to a high-frequency power amplifier.

Figures 3A, 3B:
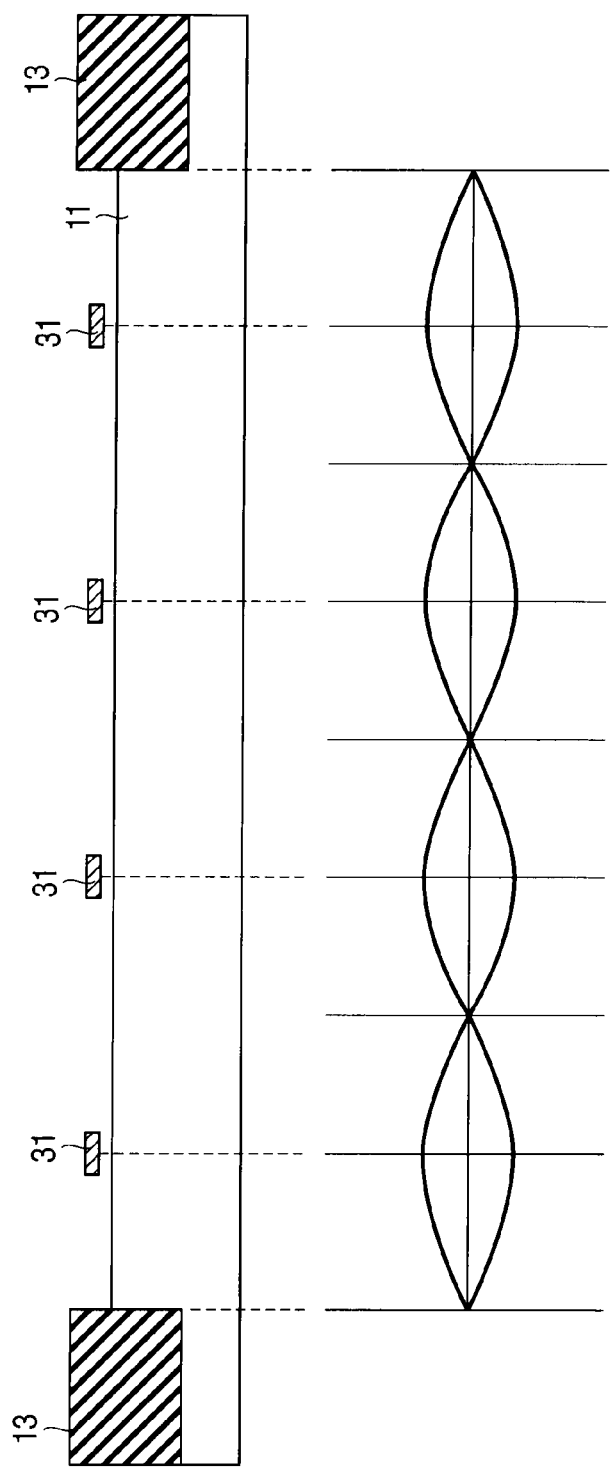
FIG. 3A and FIG. 3B are views to explain the origin of the problems of the semiconductor device according to the comparison example.

The foregoing abnormal characteristics result from the following reason. Specifically, this is because an acoustic standing wave is generated in the element region. The reason will be hereinafter described with reference to FIG. 3A and FIG. 3B.

As illustrated in FIG. 1A and FIG. 1B, the element region 12 has a rectangular shape in general. Thus, a pair of facing edges 23 and 24 is parallel with each other. Further, the gate electrodes 31 are arranged in parallel, and parallel to the edges 23 and 24. Furthermore, the gate electrodes 31 are arranged with the same pitch (same cycle (period)).

When the transistor is operated, channels are formed under the gate electrodes, and conduction carriers are accelerated by the voltage Vds applied between source and drain. The higher the voltage Vds applied between source and drain is, the higher the carriers moving speed becomes. Therefore, kinetic energy of the carriers becomes high. If a carrier having high kinetic energy collides with the crystal lattice of the semiconductor, a part of the kinetic energy is converted to lattice vibration energy. The lattice vibration energy is distributed to various wavelengths, various vibrations and various energy states. The lattice vibration includes an acoustic wave having a wavelength equal to the arrangement pitch of the gate electrode.

The acoustic wave propagating through the crystal has a property of propagating far away if the wavelength is long. In addition, the forming materials are different between the element region and the isolation region; for this reason, the magnitudes of acoustic impedance are different. Thus, the acoustic waves are reflected at the boundary between the element region and the isolation region. Therefore, if the distance between the facing edges (23 and 24 in FIG. 1A) of the element region is an integer times of the wavelength of the acoustic wave, a standing wave is generated. If the wavelength of the acoustic standing wave coincides with the arrangement pitch of the gate electrode, the intensity of the lattice vibration periodically changes in the channel region of the transistor. For this reason, the collision probability of carrier traveling in the channel with the crystal lattice periodically changes. As a result, the intensity of the acoustic standing wave is further increased. Namely, a positive feedback mechanism acts, so that the standing wave continues to exist.

The collisions of conduction carriers with crystal lattice generate new electron-hole pairs through the impact ionization phenomenon. A part of the generated electron-hole pairs changes a substrate potential; as a result, the threshold voltage of the transistor changes. The threshold voltage changes, and thereby, when the number of carriers traveling in the channel decreases, the negative resistance is observed.

The semiconductor device having the structure shown in FIG. 1A and FIG. 1B has a problem of generating abnormal transistor characteristics resulting from the acoustic standing wave. It is therefore difficult to obtain a high-frequency power amplifier having a high performance and a proper characteristic.

Various embodiments of the present invention will be hereinafter described with reference to the accompanying drawings.

Embodiment 1

FIG. 4A and FIG. 4B are views schematically illustrating the structure of a semiconductor device (having a multi-finger type layout structure) according to the first embodiment of the present invention. FIG. 4A is a plan view, and FIG. 4B is a cross-sectional view taken along the line B-B of FIG. 4A.

As shown in FIG. 4A and FIG. 4B, a semiconductor substrate (silicon substrate) 11 is provided with an element region 12. The element region 12 is surrounded by an isolation region 13 formed of an insulating film. The element region 12 has a polygonal shape defined by a plurality of edges. According to this embodiment, the element region 12 has a quadrilateral shape defined by four edges 21 to 24. The edges 21 and 22 are parallel with each other while the edges 23 and 24 are not parallel with each other.

A plurality of gate electrodes 31 is formed on a substrate 10 having the element region 12 and the isolation region 13 with a gate insulating film (not shown) interposed therebetween. The gate electrodes 31 are arranged in parallel at the same pitch, and electrically connected to each other via a common electrode 32. The gate electrodes 31 have an equal width (in the channel length direction). The gate electrodes 31 cross the element region 12. Specifically, the gate electrodes 31 cross two edges 21 and 22. More specifically, the gate electrodes 31 cross vertically to the edges 21 and 22. The gate electrodes 31 are arranged in non-parallel to the edges 23 and 24, and do not cross the edges 23 and 24. The surface of the element region 12 is formed with a source/drain diffusion layer 41. An area between neighboring diffusion layers 41 functions as a channel region.

Figure 5:
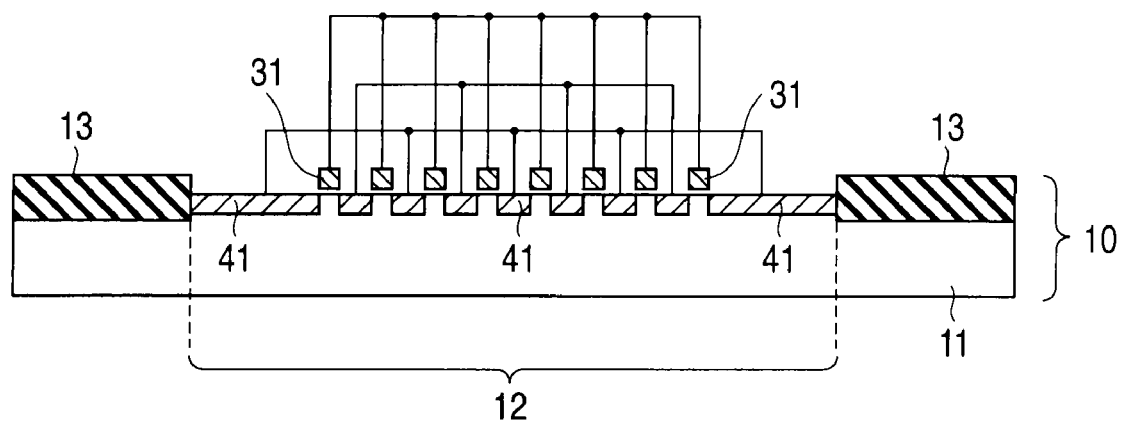
FIG. 5 is a view showing the electric connection of a semiconductor device according to the first embodiment.

FIG. 5 is a view showing electric connection of the gate electrodes 31 and the source/drain diffusion layers 41 in the semiconductor device shown in FIG. 4A and FIG. 4B. As illustrated in FIG. 5, the gate electrodes 31 are connected in common. The diffusion layers 41 are connected in common on alternate line. In this way, a plurality of MOS transistors (MIS transistors) is electrically connected in parallel, and thus, substantially function as one transistor.

In the foregoing semiconductor device, a plurality of MOS transistors (MIS transistors) is arranged in the same element region 12, and connected in parallel. As a result, it is possible to obtain a large output current. For example, the semiconductor device is applicable to a high-frequency power amplifier of a transmitter of a mobile wireless terminal.

In the foregoing semiconductor device, the gate electrodes are arranged in parallel at the same pitch in order to improve the integration density. However, in the semiconductor device of this embodiment, the edges 23 and 24 of the element region 12 are non-parallel to the gate electrodes 31. In other words, the edges 23 and 24, which do not cross any of the gate electrodes 31, are non-parallel to the gate electrodes 31. Thus, even if an acoustic wave is generated, the traveling direction of the acoustic wave is changed at the boundary between the element region 12 and the isolation region 13. This therefore serves to prevent a generation of an acoustic standing wave. As a result, it is possible to solve the problem of causing abnormal transistor characteristics, and therefore, to obtain an excellent semiconductor device having a proper characteristic.

Figure 6:
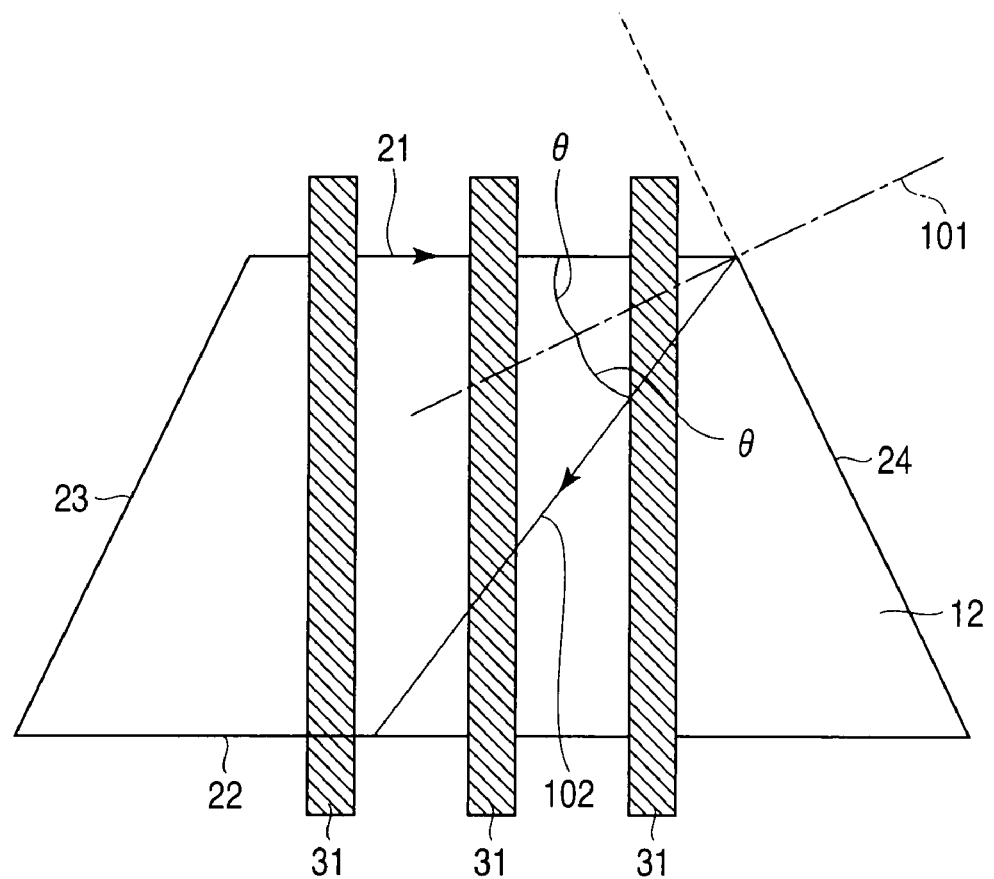
FIG. 6 is a view related to a semiconductor device according to the first embodiment, and showing edges defining the element region.

Preferably, the edges 21 to 24 of the element region 12 satisfy the following relationship in order to securely prevent a generation of the standing wave. The relationship will be described with reference to FIG. 6.

The following case is considered; specifically, an acoustic wave traveling to a direction vertical to the gate electrodes 31 is reflected by the edge 24 of the element region 12. In this case, the acoustic wave is reflected according to a general reflection law (incident angle=reflection angle). Namely, if the relationship between the edges 21 to 24 of the element region 12 is set so that the reflected wave reaches the edge 22, and not the edge 23, the standing wave is extremely hard to be generated. Specifically, when the acoustic wave traveling near the edge 21 is reflected according to a general reflection law (incident angle=reflection angle=θ), the reflected wave reaches the edge 22. In other words, a straight line 101 passing through a cross point of the edges 21 and 24 and vertical to the edge 24 is given. Preferably, the shape of the element region 12 is defined so that a straight line 102 symmetrical to the edge 21 with respect to the straight line 101 or the elongated line 102 crosses the edge 22.

Figure 7A:
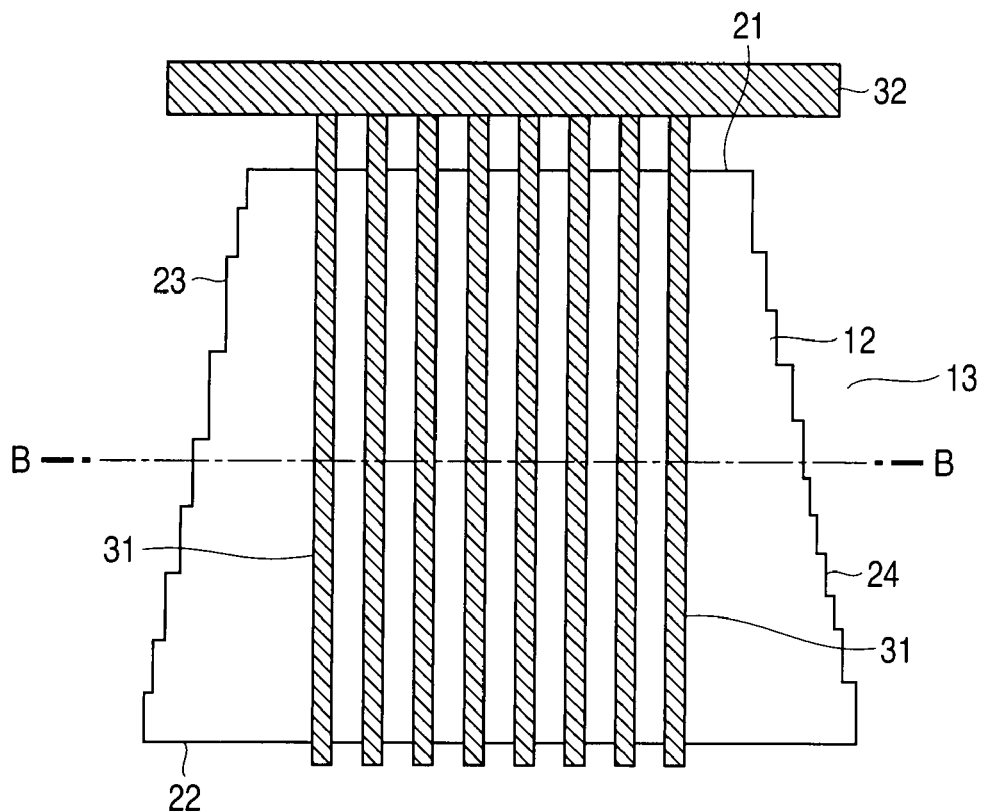
FIG. 7A and FIG. 7B are views schematically showing the structure of a semiconductor device according to the first embodiment.
Figure 7B:
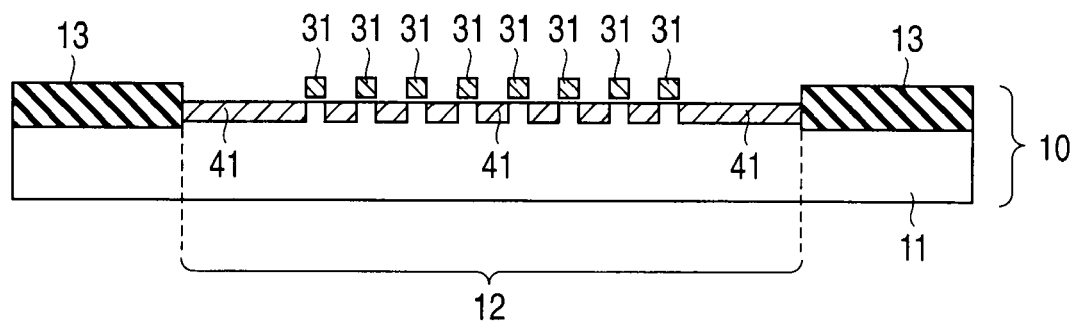

A pattern of the element region 12 is formed based on a mask pattern for photolithography. However, it is difficult in general to make strictly oblique the edge of the mask pattern. Therefore, actually, the oblique edges 23 and 24 shown in FIG. 4A are stepwise formed as shown in FIG. 7A and FIG. 7B. Namely, the oblique edges 23 and 24 are formed of a large number of micro edges if strictly seen (in the light of micro consideration). The length of the foregoing micro edge is very shorter than that of the oblique edges 23 and 24. Therefore, in the light of macro consideration, the step-like shape may be disregarded. Namely, it is possible to disregard the micro step-like shape formed resulting from the mask pattern producing technique. Therefore, even if the case shown in FIG. 7A and FIG. 7B is given, the element region 12 is regarded as a quadrilateral shape defined by the edges 21 to 24.

Embodiment 2

Figure 8A:
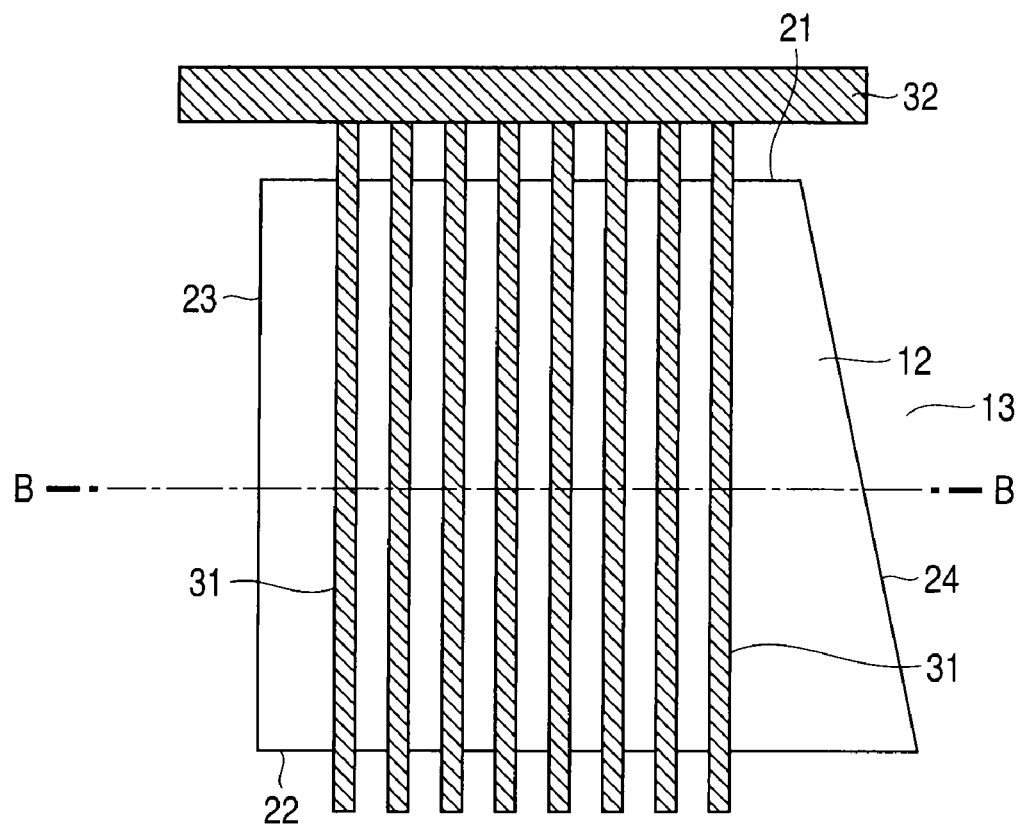
FIG. 8A and FIG. 8B are views schematically showing the structure of a semiconductor device according to the second embodiment.
Figure 8B:
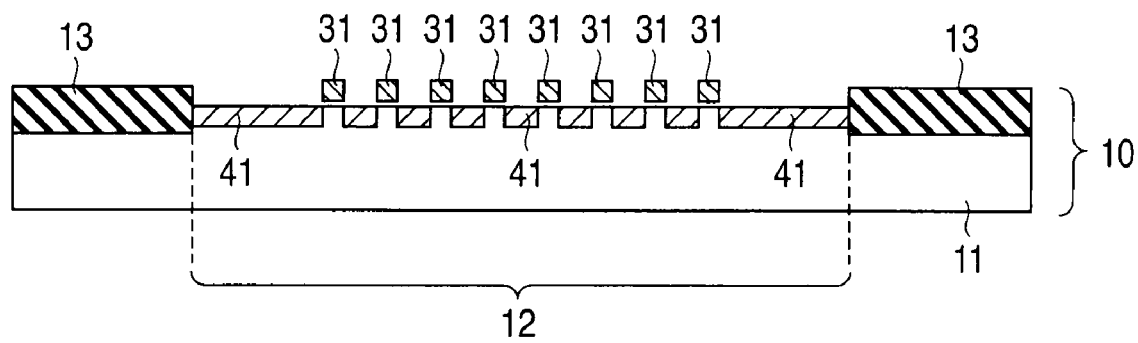

FIG. 8A and FIG. 8B are views schematically showing the structure of a semiconductor device (having a multi-finger type layout structure) according to the second embodiment of the present invention. FIG. 8A is a plan view, and FIG. 8B is a cross-sectional view taken along the line B-B of FIG. 8A. Since the basic structure of this embodiment is similar to the first embodiment, the matters described in the first embodiment are being omitted.

According to the first embodiment, the edges 23 and 24 of the element region 12 are both non-parallel to the gate electrodes 31. According to this embodiment, the edge 24 is non-parallel to the gate electrodes 31; however, the edge 23 is parallel to the gate electrodes 31. In other words, of the edges 23 and 24, which do not cross the gate electrodes 31, only one edge 24 is non-parallel to the gate electrodes 31.

According to this embodiment, the edge 24 is non-parallel to the gate electrodes 31; therefore, generation of an acoustic standing wave is prevented like the first embodiment. As a result, it is possible to solve the problem of causing abnormal transistor characteristics, and thus, to provide an excellent semiconductor device having proper characteristics.

Embodiment 3

Figure 9A:
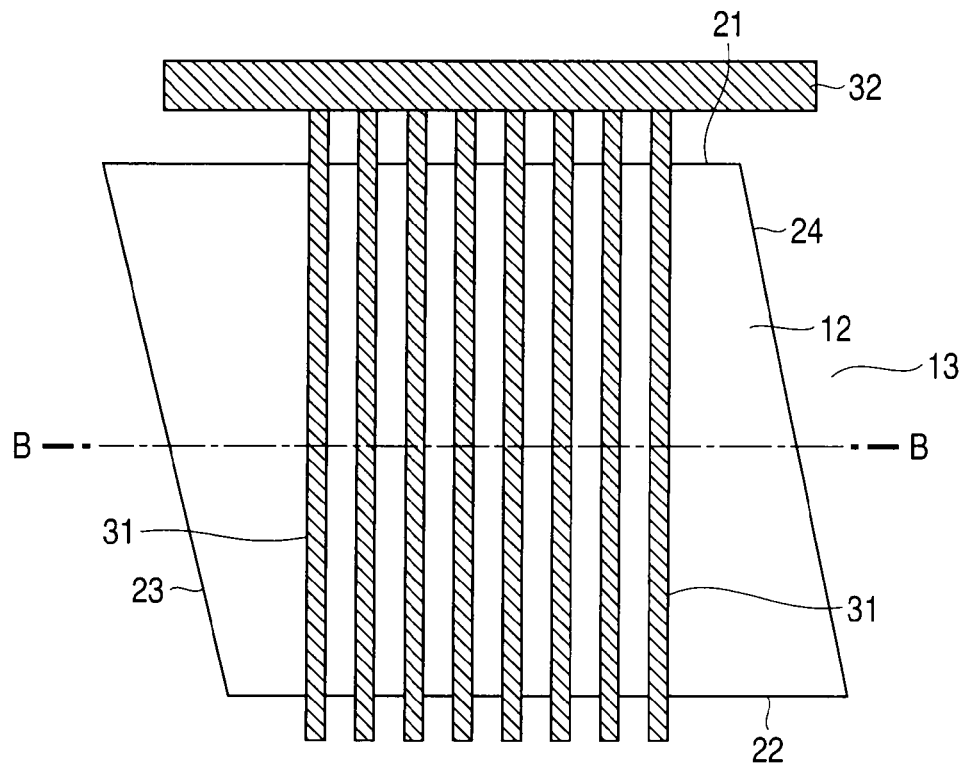
FIG. 9A and FIG. 9B are views schematically showing the structure of a semiconductor device according to the third embodiment.
Figure 9B:
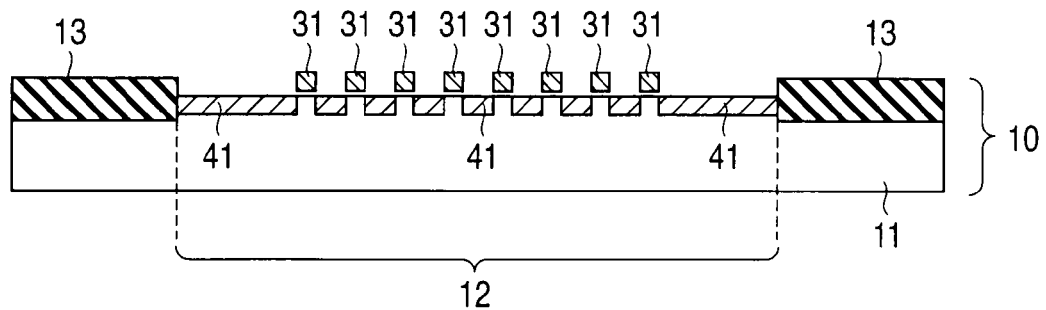

FIG. 9A and FIG. 9B are views schematically showing the structure of a semiconductor device (having a multi-finger type layout structure) according to the third embodiment of the present invention. FIG. 9A is a plan view, and FIG. 9B is a cross-sectional view taken along the line B-B of FIG. 9A. Since the basic structure of this embodiment is similar to the first embodiment, the matters described in the first embodiment are being omitted.

According to the first embodiment, the edges 23 and 24 of the element region 12 are non-parallel to each other. However, according to this embodiment, the edges 23 and 24 are parallel to each other. In this case, the edges 23 and 24 are both non-parallel to the gate electrodes. In other words, the edges 23 and 24, which do not cross the gate electrodes 31, are non-parallel to the gate electrodes 31.

According to this embodiment, the edges 23 and 24 are both non-parallel to the gate electrodes 31; therefore, generation of an acoustic standing wave is prevented like the first embodiment. As a result, it is possible to solve the problem of causing abnormal transistor characteristics, and thus, to provide an excellent semiconductor device having proper characteristics.

Embodiment 4

FIG. 10A and FIG. 10B are views schematically showing the structure of a semiconductor device (having a multi-finger type layout structure) according to the fourth embodiment of the present invention. FIG. 10A is a plan view, and FIG. 10B is a cross-sectional view taken along the line B-B of FIG. 10A. Since, the basic structure of this embodiment is similar to the first embodiment, the matters described in the first embodiment are omitted.

According to the first embodiment, the element region 12 has a quadrilateral shape defined by four edges 21 to 24. According to this embodiment, the element region 12 has a polygonal shape defined by six edges 21, 22, 23a, 23b, 24a and 24b. The edges 23a, 23b, 24a and 24b are non-parallel to the gate electrodes 31. In other words, the edges 23a, 23b, 24a and 24b, which do not cross the gate electrodes 31, are non-parallel to the gate electrodes 31.

According to this embodiment, the edges 23a, 23b, 24a and 24b are non-parallel to the gate electrodes 31; therefore, generation of an acoustic standing wave is prevented like the first embodiment. As a result, it is possible to solve the problem of causing abnormal transistor characteristics, and thus, to provide an excellent semiconductor device having proper characteristics.

Embodiment 5

Figure 11A:
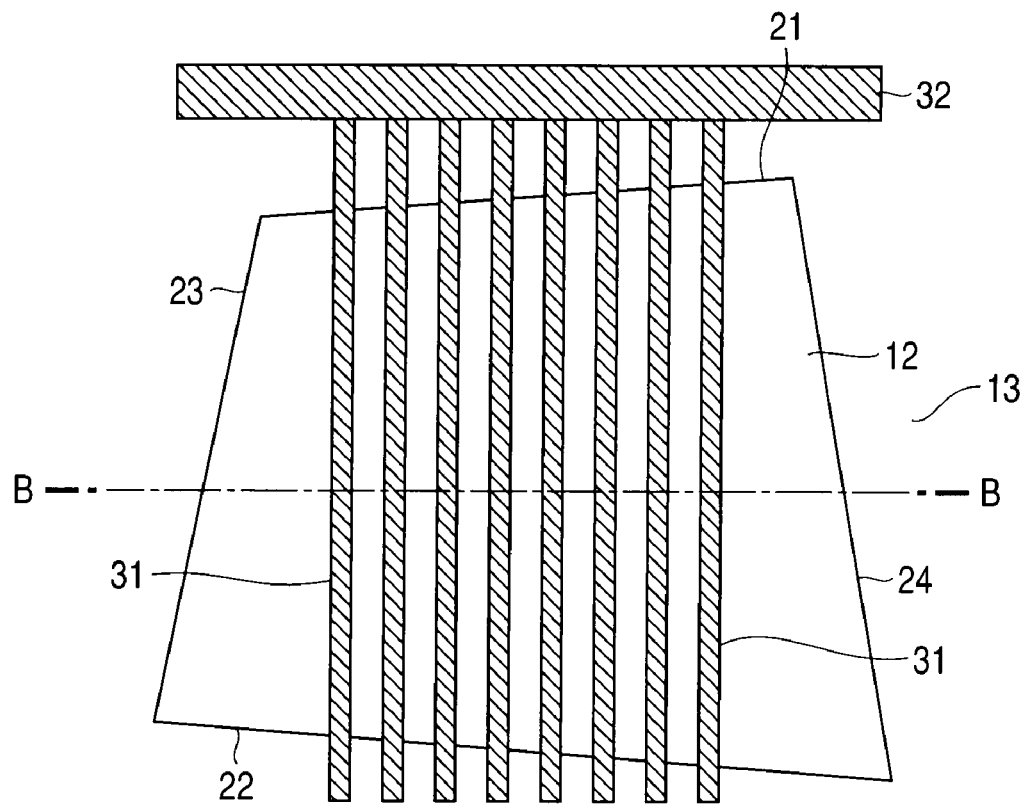
FIG. 11A and FIG. 11B are views schematically showing the structure of a semiconductor device according to the fifth embodiment.
Figure 11B:
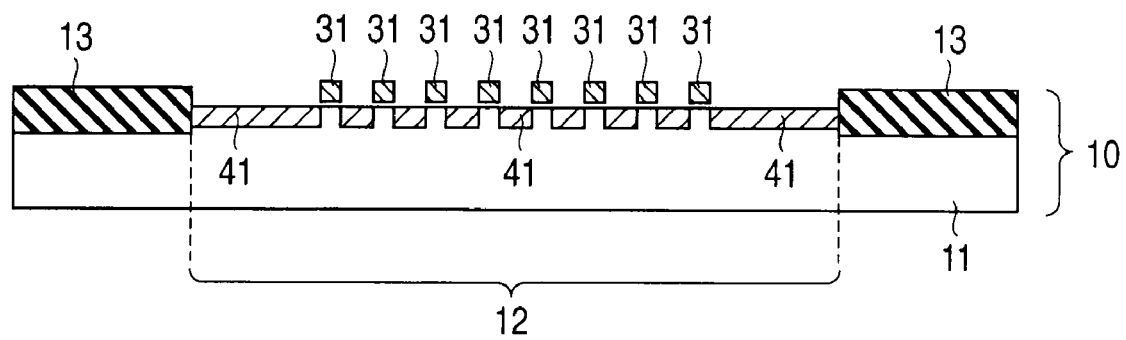

FIG. 11A and FIG. 11B are views schematically showing the structure of a semiconductor device (having a multi-finger type layout structure) according to the fifth embodiment of the present invention. FIG. 11A is a plan view, and FIG. 11B is a cross-sectional view taken along the line B-B of FIG. 11A. Since, the basic structure of this embodiment is similar to the first embodiment, the matters described in the first embodiment are omitted.

According to the first embodiment, the edges 21 and 22 of the element region 12 are both vertical to the gate electrodes 31. According to this embodiment, neither edges 21 nor 22 are vertical to the gate electrodes 31. In other words, according to this embodiment, two edges 21 and 22, which cross the gate electrodes, are non-parallel to each other.

As described above, according to this embodiment, the edges 21 and 22 are non-parallel to each other; therefore, it is possible to prevent a generation of an acoustic standing wave between the edges 21 and 22. Of course, the edges 23 and 24 are non-parallel to each other like the first embodiment; therefore, it is possible to prevent generation of an acoustic standing wave between the edges 23 and 24. As a result, according to this embodiment, it is possible to solve the problem of causing abnormal transistor characteristics, and thus, to provide an excellent semiconductor device having proper characteristics.

Embodiment 6

Figures 12A, 12B:
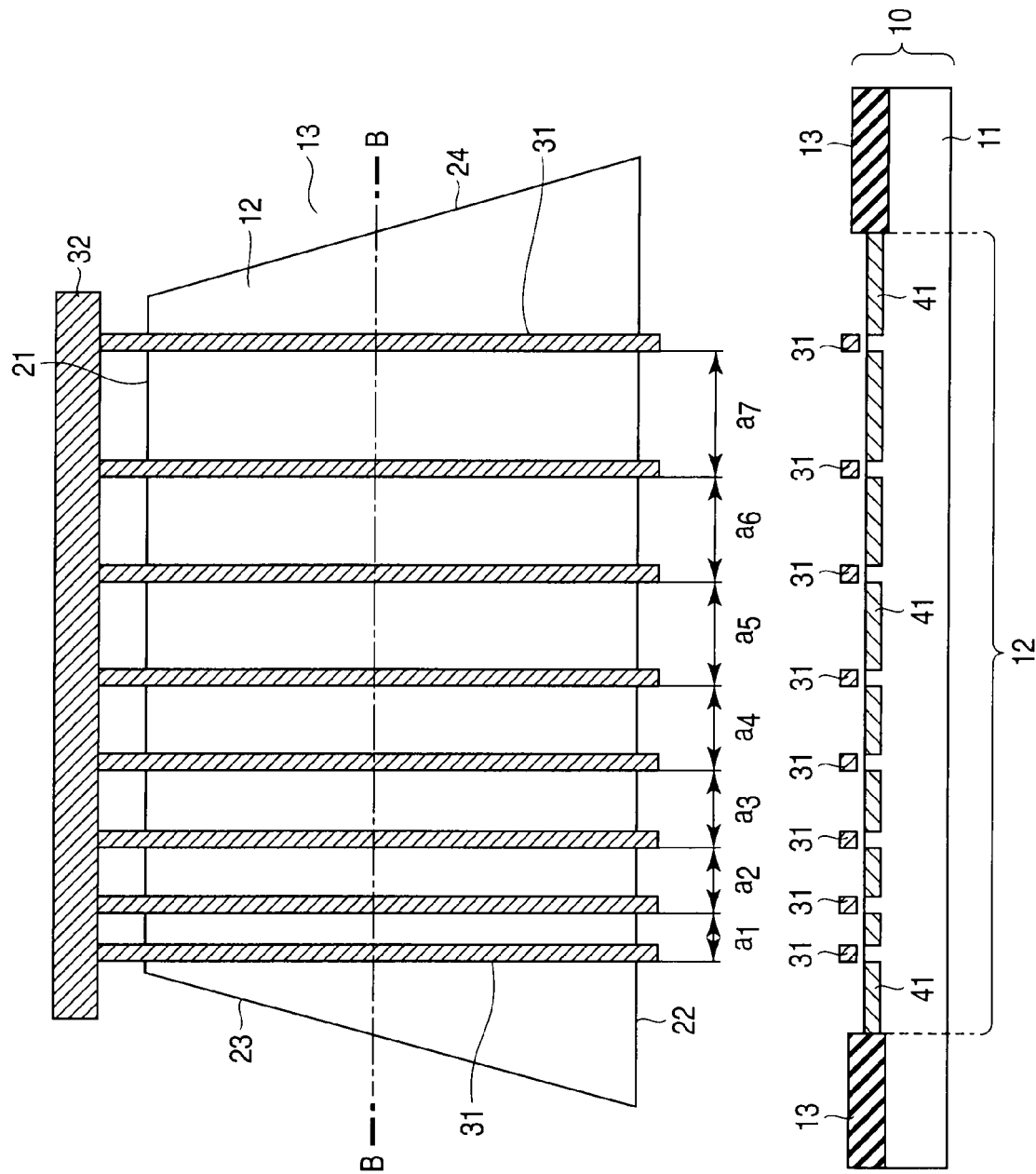
FIG. 12A and FIG. 12B are views schematically showing the structure of a semiconductor device according to the sixth embodiment.

FIG. 12A and FIG. 12B are views schematically showing the structure of a semiconductor device (having a multi-finger type layout structure) according to the sixth embodiment of the present invention. FIG. 12A is a plan view, and FIG. 12B is a cross-sectional view taken along the line B-B of FIG. 12A. Since, the basic structure of this embodiment is similar to the first embodiment, the matters described in the first embodiment are being omitted.

According to the first embodiment, a plurality of gate electrodes 31 is arranged at the same pitch. However, according to this embodiment, the gate electrodes 31 are not arranged at the same pitch. Specifically, three gate electrodes, which are successively arranged, are set as first, second and third gate electrodes. The gate electrodes 31 are arranged so that the distance (pitch) between the first and second gate electrodes and the distance (pitch) between the second and third gate electrodes are different from each other.

As described above, according to this embodiment, the gate electrodes 31 are not arranged at the same pitch. Thus, an acoustic standing wave is hard to be generated compared with the first embodiment. In other words, it is possible to prevent generation of a standing wave having a cycle (period) depending on the pitch of the gate electrode 31. Therefore, it is possible to solve the problem of causing abnormal transistor characteristics, and thus, to provide an excellent semiconductor device having proper characteristics.

In addition, according to this embodiment, the gate electrodes 31 are arranged so that all distances ($a_1, a_2, a_3, a_4, a_5, a_6, a_7$) are different from each other. In this way, a generation of a standing wave is further prevented.

The foregoing distances ($a_1, a_2, a_3, a_4, a_5, a_6, a_7$) are set so that they mutually do not have an integer time relation. In other words, the distances ($a_1, a_2, a_3, a_4, a_5, a_6, a_7$) are set so that the least common multiple of the distances ($a_1, a_2, a_3, a_4, a_5, a_6, a_7$) becomes the product of the distances ($a_1 \times a_2 \times a_3 \times a_4 \times a_5 \times a_6 \times a_7$). In this way, a generation of a standing wave is further prevented.

To give one example, the distances ($a_1, a_2, a_3, a_4, a_5, a_6, a_7$) between the gate electrodes are set as follows.

$a_1$=0.73 (μm)
$a_2$=0.96 (μm)
$a_3$=1.19 (μm)
$a_4$=1.42 (μm)
$a_5$=1.65 (μm)
$a_6$=1.88 (μm)
$a_7$=2.11 (μm)

The foregoing relationship is expressed using the following equation in general.

$$a_i = (a_1/p) \times [p+(i-1)q]$$

where, p and q are prime number, and P=73, q=23.

When the number of the gate electrodes 31 is set as N, a relation p>N is given; therefore, $a_i$ (i=1 to N) is not an integer times with respect to the optional "i".

Embodiment 7

FIG. 13A and FIG. 13B are views schematically showing the structure of a semiconductor device (having a multi-finger type layout structure) according to the seventh embodiment of the present invention. FIG. 13A is a plan view, and FIG. 13B is a cross-sectional view taken along the line B-B of FIG. 13A. Since, the basic structure of this embodiment is similar to the first embodiment, the matters described in the first embodiment are being omitted.

According to this embodiment, dummy gate electrodes 51 (nineteen in this embodiment) are provided in addition to gate electrodes 31 (five in this embodiment) used for a transistor operation. In this case, the foregoing dummy gate electrodes 51 are not used for a transistor operation. These dummy gate electrodes 51 are connected to a common electrode 52 for dummy gate electrode. The common electrode 52 is fixed to a predetermined potential (e.g., 0 V in an N-type MOS transistor) so that a dummy transistor including the dummy gate electrode 51 is not turned on. A dummy source/drain included in the dummy transistor is fixed to a predetermined potential.

The dummy gate electrodes 51 are arranged in parallel to the active gate electrodes 31. The width (in the channel length direction) of each dummy gate electrode 51 is equal to the width (in the channel length direction) of each gate electrode 31. The distance (pitch) between the dummy gate electrodes 51 is mutually equal. Also, the distance (pitch) between the dummy gate electrodes 51 is equal to the distance (pitch) between the dummy gate electrode 51 and the active gate electrode 31. Therefore, the total, that is, 24 electrodes (five active gate electrodes and 19 dummy gate electrodes) are arranged in parallel and at the same pitch. As described above, these electrodes are periodically arranged, and thereby, the following advantage is obtained. Specifically, precise processing is carried out at a high accuracy in a photolithography process and an etching process. Therefore, a uniform gate dimension is obtained, and thus, a semiconductor device having uniform characteristic is obtained.

Like the sixth embodiment, the gate electrodes 31 are not arranged at the same pitch. Specifically, three gate electrodes 31 optionally and successively arranged are set as first, second and third gate electrodes. A plurality of gate electrodes 31 is arranged so that the distance (pitch) between the first and second gate electrodes and the distance (pitch) between the second and third gate electrodes are different from each other. Therefore, a dummy gate electrode provided between the first and second gate electrodes is set as a first dummy gate electrode, and a dummy gate electrode provided between the second and third gate electrodes is set as a second dummy gate electrode. The number of the first dummy gate electrodes differs from the number of the second dummy gate electrodes. The foregoing structure is employed, and thereby, an acoustic standing wave is hard to be generated compared with the first embodiment. In other words, it is possible to prevent generation of the standing wave having a cycle (period) depending on the pitch of the gate electrode 31. Therefore, it is possible to solve the problem of causing abnormal transistor characteristics, and thus, to provide an excellent semiconductor device having proper characteristics.

Incidentally, all distances (four in this embodiment) between gate electrodes 31 are preferred to be different from each other like the sixth embodiment. In addition, each distance may be set not to have a relation of integer times like the sixth embodiment. Each distance between the gate electrodes may be set to satisfy the following equation like the sixth embodiment.

$$a_i = (a_1/p) \times [p + (i-1)q]$$

As described above, according to this embodiment, the acoustic standing wave is hard to be generated, and it is possible to prevent a problem of causing abnormal transistor characteristics. In addition, precise processing is carried out at a high accuracy in a photolithography process and an etching process. Therefore, a uniform gate dimension is obtained, and thus, a semiconductor device having a proper characteristic is obtained.

As seen from FIG. 13A and FIG. 13B, the element region 12 has a polygonal shape defined by 10 edges 21, 22, 23a, 23b, 23c, 23d, 24a, 24b, 24c and 24d. The edges 23a, 23b, 23c, 23d, 24a, 24b, 24c and 24d are non-parallel to the gate electrodes 31. Specifically, according to the example shown in FIG. 13A and FIG. 13B, the edges, which do not cross the gate electrodes 31, are non-parallel to the gate electrodes 31. However, according to this embodiment, the edges, which do not cross the gate electrodes 31, may be parallel to the gate electrodes 31. In also case, the same effect as described above is obtained.

Embodiment 8

For example, as described in the first embodiment, the following structure is employed; specifically, the edges, which do not cross the gate electrodes, are non-parallel to the gate electrodes. In this way, generation of an acoustic standing wave is prevented, and a semiconductor device having proper characteristics is obtained. However, the inventors of this application confirmed that even if the foregoing structure is employed, abnormal characteristics may still remain. The foregoing abnormal characteristics will be hereinafter described.

Figure 14:
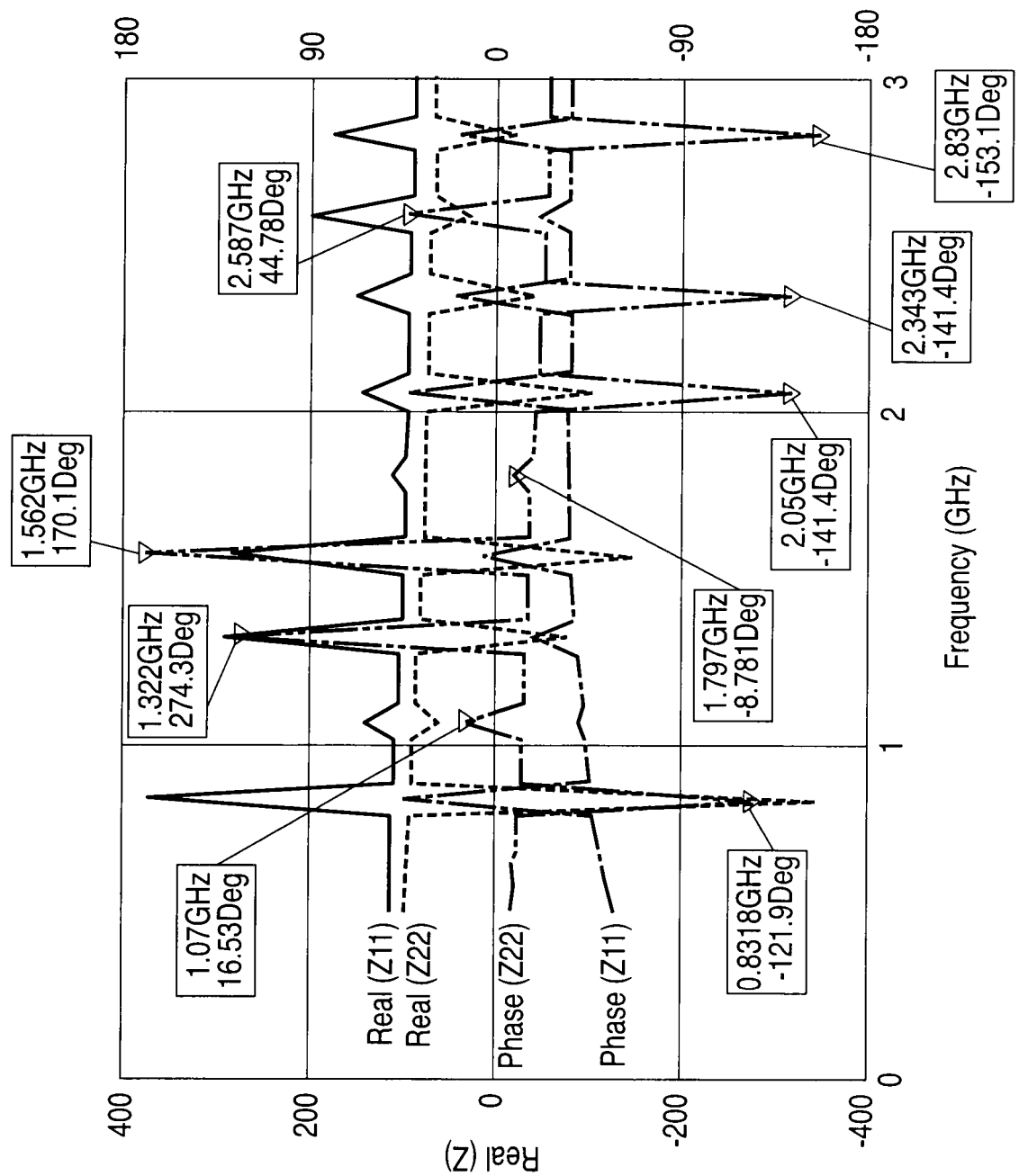
FIG. 14 is a graph showing frequency characteristics to explain problems.

FIG. 14 is a graph showing a frequency characteristic of the semiconductor device having the foregoing structure. In the graph of FIG. 14, the horizontal axis takes a frequency, and the left-side vertical axis takes a real part of impedance, and further, the right-side vertical axis takes a phase. A source potential is set as a common potential, and in the graph, Z11 denotes impedance from the side of the gate electrode, and Z22 denotes impedance from the side of the drain electrode. A network analyzer is used for measurement, and two-port S-parameter is measured, and then, converted to impedance.

As seen from FIG. 14, the peaks of impedance are periodically observed. The cycle (period) of the peak was approximately constant, that is, 125 MHz. The foregoing abnormal frequency characteristic can not be explained using a circuit simulation model. Therefore, a transistor having the foregoing abnormal characteristic is not suitable to an analog circuit; as a result, it is difficult to apply the transistor to a high-frequency power amplifier.

The reason why the foregoing abnormal characteristic occurs is because an acoustic standing wave is generated in the element region. Specifically, two edges crossed by the gate electrodes are parallel with each other. For this reason, an acoustic standing wave is generated between two edges crossed by the gate electrodes due to the same mechanism as the foregoing standing wave generation mechanism. According to this embodiment, the generation of the acoustic standing wave is prevented in the following manner.

Figure 15A:
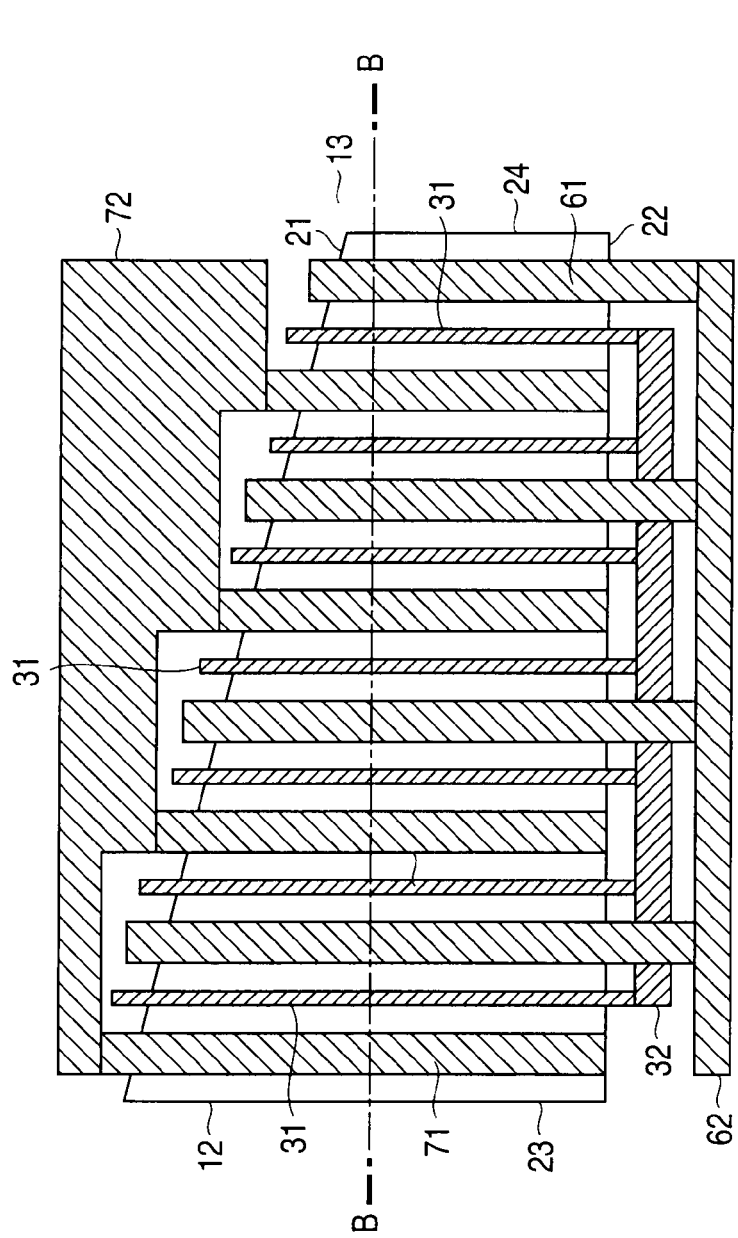
FIG. 15A and FIG. 15B are views schematically showing the structure of a semiconductor device according to the eighth embodiment.
Figure 15B:
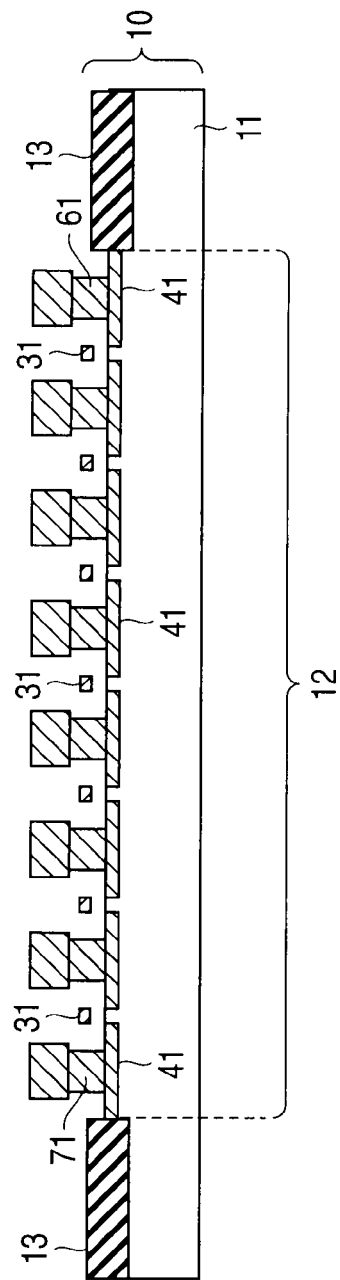

FIG. 15A and FIG. 15B are views schematically showing the structure of a semiconductor device (having a multi-finger type layout structure) according to the eighth embodiment of the present invention. FIG. 15A is a plan view, and FIG. 15B is a cross-sectional view taken along the line B-B of FIG. 15A. Since, the basic structure of this embodiment is similar to the first embodiment, the matters described in the first embodiment are being omitted.

As shown in FIG. 15A and FIG. 15B, a semiconductor substrate (silicon substrate) 11 is provided with an element region 12. The element region 12 is surrounded by an isolation region 13 formed of an insulating film. The element region has a polygonal shape defined by a plurality of edges. According to this embodiment, the element region 12 has a quadrilateral shape defined by four edges 21 to 24. The edges 21 and 22 are non-parallel with each other while the edges 23 and 24 are parallel with each other.

A plurality of gate electrodes 31 is formed on the substrate 10 having the element region 12 and the isolation region 13 with a gate insulating film (not shown) interposed therebetween. These gate electrodes 31 are arranged in parallel with each other at the same pitch, and electrically connected via a common electrode 32. The gate electrodes 31 further cross the element region 12. Specifically, the gate electrodes 31 cross two edges 21 and 22. More specifically, the gate electrodes vertically cross the edge 22 while obliquely cross the edge 21. However, the gate electrodes 31 do not cross the edges 23 and 24. The surface of the element region 12 is formed with a source/drain diffusion layer 41. An area between neighboring diffusion layers 41 functions as a channel region. The diffusion layer 41 is connected with a source electrode 61 and a drain electrode 71. Each source electrode 61 is connected to a common electrode 62, and each drain electrode 71 is connected to a common electrode 72.

As described above, in the semiconductor device of this embodiment, the two edges 21 and 22 through which the gate electrodes 31 cross are non-parallel with each other, and the gate electrodes 31 obliquely cross the edge 21. Therefore, even if an acoustic wave is generated, the traveling direction of the acoustic wave is changed at the boundary between the element region 12 and the isolation region 13. Thus, it is possible to prevent generation of an acoustic standing wave. In addition, the gate electrode width of the gate electrode 31 (the width in the channel width direction of the overlapped portion of the gate electrode 31 and the element region 12) is different. Therefore, even if an acoustic standing wave is generated along each gate electrode 31, the gate electrode width is different; as a result, the cycle and phase of the standing wave are different from each other. In this way, it is possible to solve the problem of causing abnormal transistor characteristics, and thus, to provide an excellent semiconductor device having a proper characteristic.

Preferably, the maximum gate electrode width (Wmax) of the gate electrodes 31 is smaller than three times as much as the minimum gate electrode width (Wmin). That is, preferably, the gate electrode width has a relation of Wmax<3 Wmin. If Wmax=3 Wmin, a frequency of a third harmonic of the acoustic standing wave generated at the gate electrode 31 having the maximum gate electrode width coincides with that of a fundamental wave of the acoustic standing wave generated at the gate electrode 31 having the minimum gate electrode width. As a result, the foregoing two frequency components have an influence each other, and thus, the influence of the acoustic standing wave is increased. Therefore, preferably, the gate electrode width has a relation of Wmax<3 Wmin. A second harmonic has no need be specifically considered because an influence given to an electric impedance change is offset in the same gate electrode.

Preferably, the gate electrode width of the gate electrodes makes an arithmetic progression. That is, preferably, the gate electrode width of each gate electrode is determined so that the difference in the gate electrode width between neighboring two gate electrodes becomes equal. In the manner described above, the gate electrodes are arranged, and thereby, resonance energy generated by each gate electrode can be dispersed at equal density with respect to a frequency. In order to disperse resonance energy generated in each gate electrode at equal density with respect to a logarithm of a frequency, the gate electrode width of the gate electrodes preferably makes a geometric progression. That is, preferably, the gate electrode width of each gate electrode is determined so that a ratio of the gate electrode width of neighboring two gate electrodes becomes equal.

According to the foregoing embodiment, as shown in FIG. 15A, the edges 23 and 24 are parallel with each other. For example, as illustrated in FIG. 11A, the edges 23 and 24 may be non-parallel with each other. In this case, generation of the standing wave between the edges 23 and 24 is prevented, and transistor characteristics are more properly obtained.

Various embodiments of the present invention have been described above. In these cases, the matters described in each embodiment may be properly combined.

The structure described in each embodiment is applicable to a p-type MOS transistor (p-type MIS transistor) in addition to an n-type MOS transistor (n-type MIS transistor).

The semiconductor device described in the foregoing each embodiment is also applicable to a constant-current source of an analog circuit in addition to the high-frequency power amplifier already described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a substrate including an element region having a polygonal shape defined by a plurality of edges, and an isolation region surrounding the element region; and
    a plurality of gate electrodes provided on the substrate, crossing the element region, arranged in parallel with each other, and electrically connected with each other,
    wherein at least one of the edges does not cross any of the gate electrodes, and is not parallel to a longitudinal direction of the gate electrodes,
    wherein a plurality of the gate electrodes cross the same edge, and
    wherein two of the edges crossed by the gate electrodes are not parallel with each other.

2. The device according to claim 1, wherein the gate electrodes include first, second and third gate electrodes that are being successively arranged, and a distance between the first and second gate electrodes is different from a distance between the second and third gate electrodes.

3. The device according to claim 1, wherein the element region has a quadrilateral shape.

4. The device according to claim 1, wherein the gate electrodes are arranged at the same pitch.

5. The device according to claim 1, wherein the edge not crossing any of the gate electrodes and not parallel to the gate electrodes is formed like steps.

\* \* \* \* \*